US009940867B2

(12) United States Patent
Tsuchi

(10) Patent No.: US 9,940,867 B2
(45) Date of Patent: Apr. 10, 2018

(54) LEVEL SHIFT CIRCUIT AND DISPLAY DRIVER

(71) Applicant: LAPIS Semiconductor Co., Ltd., Yokohama (JP)

(72) Inventor: Hiroshi Tsuchi, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 15/361,213

(22) Filed: Nov. 25, 2016

(65) Prior Publication Data
US 2017/0154568 A1 Jun. 1, 2017

(30) Foreign Application Priority Data

Nov. 26, 2015 (JP) ................................ 2015-230383

(51) Int. Cl.
| G06F 3/038 | (2013.01) |
| G09G 5/00 | (2006.01) |
| G09G 3/20 | (2006.01) |
| G11C 19/00 | (2006.01) |
| H03K 19/017 | (2006.01) |
| H03K 19/0185 | (2006.01) |

(52) U.S. Cl.
CPC ........... *G09G 3/2092* (2013.01); *G11C 19/00* (2013.01); *H03K 19/017* (2013.01); *H03K 19/018521* (2013.01); *G09G 2300/043* (2013.01); *G09G 2300/0809* (2013.01); *G09G 2310/027* (2013.01); *G09G 2310/0286* (2013.01); *G09G 2310/0289* (2013.01); *G09G 2310/0291* (2013.01); *G09G 2330/06* (2013.01)

(58) Field of Classification Search
CPC ..... G09G 2300/043; G09G 2300/0809; G09G 2310/027; G09G 2310/0286; G09G 2310/0289; G09G 2310/0291; G09G 2330/06; G09G 3/2092; G11C 19/00; H03K 19/017; H03K 19/018521
See application file for complete search history.

(56) References Cited

U.S. PATENT DOCUMENTS

2003/0146923 A1* 8/2003 Nakahira ............. G09G 3/3696
345/690
2007/0242024 A1* 10/2007 Sung .................... G09G 3/3688
345/100

FOREIGN PATENT DOCUMENTS

JP 2013-131964 A 7/2013

* cited by examiner

*Primary Examiner* — Insa Sadio
(74) *Attorney, Agent, or Firm* — Rabin & Berdo, P.C.

(57) ABSTRACT

A level shift circuit configured to generate an output signal having higher amplitude than that of an input signal. The level shift circuit includes serially-connected first and second level shift circuit for two-step amplitude increase of the input signal. The first level shift circuit includes first to fourth transistors, each of which has a control terminal and first and second current terminals, and first and second resistance elements respectively connected between the first and third transistors, and between the second and fourth transistors. A potential difference between two ends of each resistance element is respectively smaller than, or no smaller than, a respective predetermined potential difference when a current does not flow, or flows, therethrough. The second level shift circuit has fifth to tenth transistors, each of which has a control terminal and first and second current terminals. The output signal is outputted through a connection between the second current terminals of the fifth and ninth transistors.

12 Claims, 9 Drawing Sheets

LEVEL SHIFT CIRCUIT AND DISPLAY DRIVER

BACKGROUND OF THE INVENTION

Technical Field

The present invention relates to a level shift circuit that shifts the level of a data signal, and a display driver that includes the level shift circuit.

Background Art

In recent years, active matrix displays using a liquid display device or organic EL element have become the mainstream of display devices. In such display devices, a larger screen, higher resolution, and higher image quality such as improvement of video characteristics are demanded, which is causing an increase in voltage amplitude of a signal (gradation signal) supplied to a display panel by a column driver (display driver) that drives the display panel.

On the other hand, due to the demands for high-speed transfer with a smaller number of wiring lines, lower EMI (electro-magnetic interference), and the like, various control signals and picture data signals supplied from the display controller to the column driver are made to have lower amplitude. Inside of the display driver, in order to suppress an increase in the area of a logic circuit that processes a larger amount of data (cost increase) caused by the higher resolution and a larger number of gradation levels, a very fine process is employed, which lowers the power supply voltage of the logic circuit. That is, in a display driver, a lower voltage is required for the input part, and a higher voltage is required for the output part.

In order to achieve this property, a display driver is provided with a level shift circuit that converts a low voltage signal of the input part to a high voltage signal of the output part (see Japanese Patent Application Laid-open Publication No. 2013-131964, for example). The level shift circuit includes a level converter and a buffer part. The level converter is configured to shift the level of a digital signal of low amplitude (VDD1/VSS) to high amplitude (VDD2/VSS) in one phase. The buffer part conducts the impedance conversion on the voltage signal of high amplitude (VDD2/VSS), which was subjected to the level shift.

In the level converter of the level shift circuit, a diode-connected P-channel transistor limits the driving current of a transistor that charges the level shift circuit. That is, the potential of each end of the diode-connected P-channel transistor changes while keeping the potential difference between the two, thereby shortening the period of time in which the P-channel transistor and the N-channel transistor, which constitute an inverter in the buffer part, are turned on at the same time. This makes it possible to suppress the through current, and as a result, the operation speed of the level shift circuit can be improved.

SUMMARY OF THE INVENTION

However, even when the above-mentioned level shift circuit includes a diode-connected transistor, if a difference between the amplitude of the input digital signal and the amplitude of the output signal that was subjected to the level shift is significant, the level shift circuit does not function properly in some cases. That is, because the amplitude of the gate-source voltage of a P-channel transistor that conducts charging is much greater than that of the gate-source voltage of an N-channel transistor that conducts discharging, the capacities of the two transistors differ greatly, and as a result, the level shift circuit does not function properly. Possible solutions to make the level shift circuit function correctly include increasing the size of the transistors used for this level shift circuit, but this would cause a significant increase in amount of the circuit.

In order to solve the problems, the present invention aims at providing a level shift circuit that is capable of conducting a rapid level shift operation without causing a significant increase in amount of the circuit, and a display driver that includes such a level shift circuit.

A level shift circuit according to an aspect of the invention configured to generate an output signal having higher amplitude than that of an input signal, includes a first transistor of a first conductivity type, having a control terminal for receiving the input signal, a first current terminal for receiving a first power supply, and a second current terminal, a second transistor of the first conductivity type, having a control terminal for receiving a signal having a phase opposite to that of the input signal, a first current terminal for receiving the first power supply, and a second current terminal, a third transistor of a second conductivity type, having a control terminal connected to the second current terminal of the second transistor, a first current terminal for receiving a second power supply, and a second current terminal, a fourth transistor of the second conductivity type, having a control terminal connected to the second current terminal of the first transistor, a first current terminal for receiving the second power supply, and a second current terminal, a first resistance element connected between the second current terminal of the first transistor and the second current terminal of the third transistor, a potential difference between two ends of the first resistance element being respectively smaller than, or no smaller than, a predetermined first potential difference when the first resistance element does not have, or has, current between the first and third transistors flowing therethrough, a second resistance element connected between the second current terminal of the second transistor and the second current terminal of the fourth transistor, a potential difference between two ends of the second resistance element being respectively smaller than, or no smaller than, a predetermined second potential difference when the second resistance element does not have, or has, current between the second and fourth transistors flowing therethrough, a fifth transistor of the first conductivity type, having a control terminal connected to the second current terminal of the first transistor, a first current terminal for receiving the first power supply, and a second current terminal, a sixth transistor of the first conductivity type, having a control terminal connected to the second current terminal of the second transistor, a first current terminal for receiving the first power supply terminal, and a second current terminal, a seventh transistor of the second conductivity type, having a control terminal connected to the second current terminal of the sixth transistor, a first current terminal for receiving a third power supply, and a second current terminal, an eighth transistor of the second conductivity type, having a control terminal connected to the second current terminal of the fifth transistor, a first current terminal for receiving the third power supply, and a second current terminal, a ninth transistor of the second conductivity type, having a control terminal connected to the second current terminal of the third transistor, a first current terminal connected to the second current terminal of the seventh transistor, and a second current terminal connected to the second current terminal of the fifth transistor, a tenth transistor of the second conductivity type, having a control terminal connected to the second current terminal of the fourth transistor, a first current terminal connected to the second current terminal of the eighth transistor, and a second current terminal connected to the second current terminal of the sixth transistor, a first output node connected to the second current terminal of the fifth transistor and the second current terminal of the ninth transistor, for outputting the output signal, and a second output node connected to the second current terminal of the sixth transistor and the second current terminal of the tenth transistor, for outputting a signal having a phase opposite to that of the output signal.

A level shift circuit according to another aspect of the invention configured to generate an output signal having higher amplitude than that of an input signal, includes a first transistor having a control terminal for receiving the input signal, a first current terminal for receiving a first power supply, and a second current terminal, a second transistor having a control terminal for receiving a signal having a phase opposite to that of the input signal, a first current terminal for receiving the first power supply, and a second current terminal, a third transistor having a control terminal connected to the second current terminal of the second transistor, a first current terminal for receiving a second power supply, and a second current terminal, a fourth transistor having control terminal connected to the second current terminal of the first transistor, a first current terminal for receiving the second power supply, and a second current terminal, a first resistance element connected between the second current terminal of the first transistor and the second current terminal of the third transistor, a potential difference between two ends of the first resistance element being respectively smaller than, or no smaller than, a predetermined first potential difference when the first resistance element does not have, or has, current between the first and third transistors flowing therethrough, a second resistance element connected between the second current terminal of the second transistor and the second current terminal of the fourth transistor, a potential difference between two ends of the second resistance element being respectively smaller than, or no smaller than, a predetermined second potential difference when the second resistance element does not have, or has, current between the second and fourth transistors flowing therethrough, a fifth transistor having a control terminal connected to the second current terminal of the first transistor, a first current terminal for receiving the first power supply, and a second current terminal, a sixth transistor having a control terminal connected to the second current terminal of the second transistor, a first current terminal for receiving the first power supply, and a second current terminal, a seventh transistor having a control terminal connected to the second current terminal of the sixth transistor, a first current terminal for receiving a third power supply, and a second current terminal, an eighth transistor having a control terminal connected to the second current terminal of the fifth transistor, a first current terminal for receiving the third power supply, and a second current terminal, a ninth transistor having a control terminal connected to the second current terminal of the third transistor, a first current terminal connected to the second current terminal of the seventh transistor, and a second current terminal connected to the second current terminal of the fifth transistor, the output signal being outputted through a connection between the second current terminals of the fifth and ninth transistors, and a tenth transistor having a control terminal connected to the second current terminal of the fourth transistor, a first current terminal connected to the second current terminal of the eighth transistor, and a second current terminal connected to the second current terminal of the sixth transistor, a signal having a phase opposite to that of the output signal being outputted through a connection between the second current terminals of the sixth and tenth transistors.

A display driver according to an aspect of the invention for driving a display panel, includes a level shift circuit configured to generate a level-shifted pixel data signal by increasing amplitude of a pixel data signal that represents a brightness level of a pixel in an image, a digital analog converter configured to convert the level-shifted pixel data signal to a voltage value, and an output buffer configured to apply a pixel driving voltage having the voltage value to a data line of the display panel. The level shift circuit includes a first transistor of a first conductivity type, having a control terminal for receiving the pixel data signal, a first current terminal for receiving a first power supply, and a second current terminal, a second transistor of the first conductivity type, having a control terminal for receives a signal having a phase opposite to that of the pixel data signal, a first current terminal for receiving the first power supply, and a second current terminal, a third transistor of a second conductivity type, having a control terminal connected to the second current terminal of the second transistor, a first current terminal for receiving a second power supply, and a second current terminal, a fourth transistor of the second conductivity type, having a control terminal connected to the second current terminal of the first transistor, a first current terminal for receiving the second power supply, and a second current terminal, a first resistance element connected between the second current terminal of the first transistor and the second current terminal of the third transistor, a potential difference between two ends of the first resistance element being respectively smaller than, or no smaller than, a predetermined first potential difference when the first resistance element does not have, or has, current between the first and third transistors flowing therethrough, a second resistance element connected between the second current terminal of the second transistor and the second current terminal of the fourth transistor, a potential difference between two ends of the second resistance element being respectively smaller than, or no smaller than, a predetermined second potential difference when the second resistance element does not have, or has, current between the second and fourth transistors flowing therethrough, a fifth transistor of the first conductivity type, having a control terminal connected to the second current terminal of the first transistor, a first current terminal for receiving the first power supply, and a second current terminal, a sixth transistor of the first conductivity type, having a control terminal connected to the second current terminal of the second transistor, a first current terminal for receiving the first power supply terminal, and a second current terminal, a seventh transistor of the second conductivity type, having a control terminal connected to the second current terminal of the sixth transistor, a first current terminal for receiving a third power supply, and a second current terminal, an eighth transistor of the second conductivity type, having a control terminal connected to the second current terminal of the fifth transistor, a first current terminal for receiving the third power supply, and a second current terminal, a ninth transistor of the second conductivity type, having a control terminal connected to the second current terminal of the third transistor, a first current terminal connected to the second current terminal of the seventh transistor, and a second current terminal connected to the second current terminal of the fifth transistor, a tenth transistor of the second conductivity type, having a control terminal connected to the second current terminal of the fourth transistor, a first current terminal connected to the second current terminal of the eighth transistor, and a second current terminal connected to the second current terminal of the sixth transistor, a first output node connected to the second current terminal of the fifth transistor and the second current terminal of the ninth transistor, for outputting the level-shifted pixel data signal, and a second output node connected to the second current terminal of the sixth transistor and the second current terminal of the tenth transistor, for outputting a signal having a phase opposite to that of the level-shifted pixel data signal.

In the present invention, a two-phase level shift is conducted in which an input signal of low amplitude is first converted to a voltage signal of medium amplitude by the first level shift part, and then the voltage signal is converted to a voltage signal of high amplitude by the second level shift part. By converting an input signal of low amplitude to a voltage signal of high amplitude through two phases, it is possible to use transistors with a low current driving capability for the first and second level shift part. This makes it possible to reduce the area occupied by the level shift circuit.

Furthermore, in each of the first and second level shift parts, a resistance element that causes the current restricting effect is provided on a path of an electric current that flows from the transistor on the higher potential side to the transistor on the lower potential side to restrict a through current in each level shift part. This makes it possible to increase the operation speed of the level shift circuit.

DETAILED DESCRIPTION OF THE INVENTION

Figure 1:
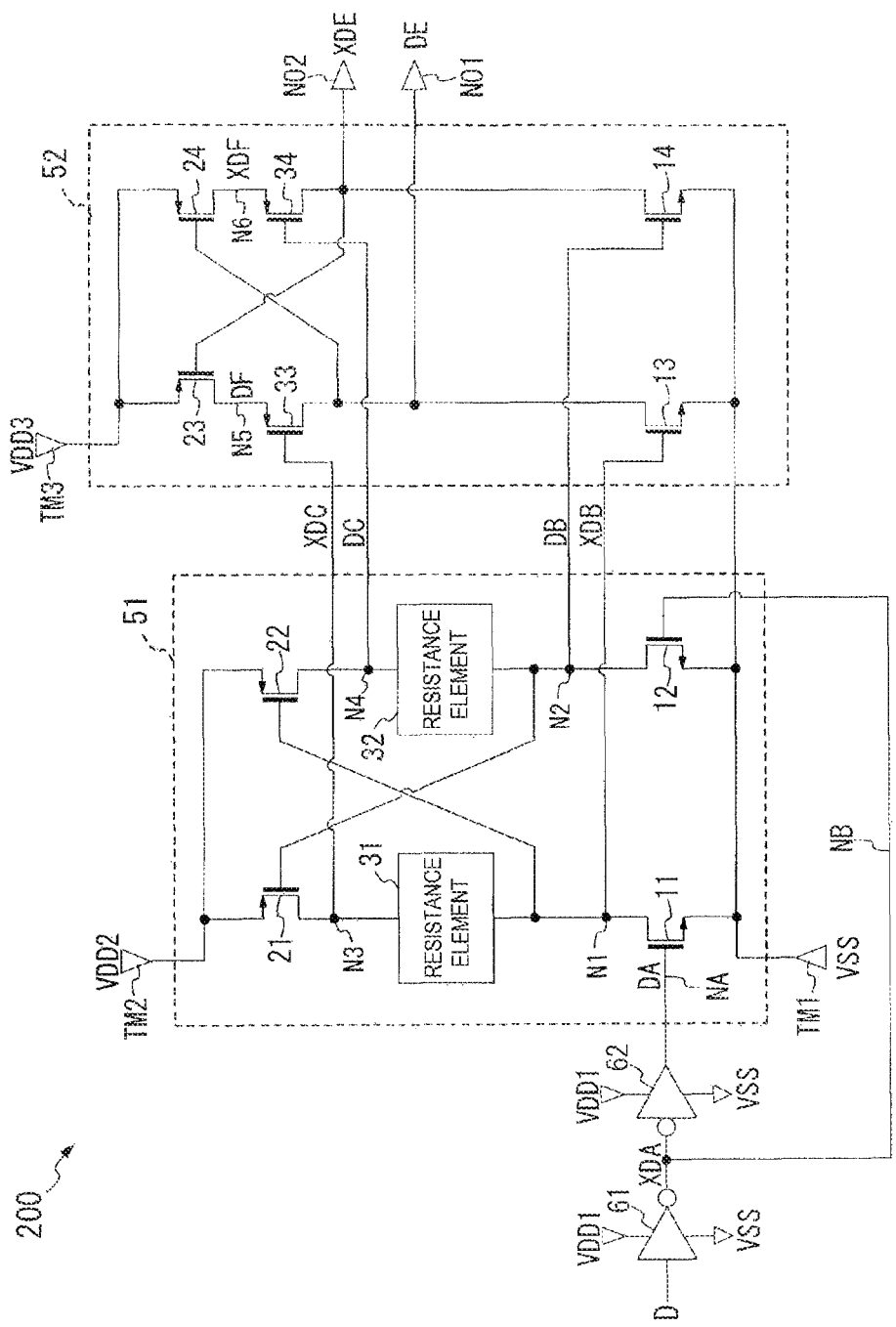
FIG. 1 is a circuit diagram showing the configuration of a level shift circuit 200 of the present invention.

FIG. 1 is a circuit diagram showing a level shift circuit 200 of an embodiment of the present invention. As shown in FIG. 1, the level shift circuit 200 includes inverters 61, 62, a first level shift circuit 51, and a second level shift circuit 52. The level shift circuit 200 conducts the level shift to increase the signal level of an input digital signal D through two phases by the first level shift circuit 51 and the second level shift circuit 52.

In FIG. 1, the inverters 61 and 62 receive a low power supply potential VDD1 and a reference power supply potential VSS to operate.

When the input digital signal D is a signal of high level having the low power supply voltage VDD1, the inverter 61 supplies an input digital signal XDA of low level having the reference power supply voltage VSS to the inverter 62 and the first level shift circuit 51 via an input node NB. On the other hand, when the input digital signal D is a signal of low level having the reference power supply voltage VSS, the inverter 61 supplies an input digital signal XDA of high level having the low power supply voltage VDD1 to the inverter 62 and the first level shift circuit 51 via an input node NB.

When the input digital signal XDA is a signal of high level having the low power supply voltage VDD1, the inverter 62 supplies an input digital signal DA of low level having the reference power supply voltage VSS to the first level shift circuit 51 via an input node NA. On the other hand, when the input digital signal XDA is a signal of low level having the reference power supply potential VSS, the inverter 62 supplies an input digital signal DA of high level having the low power supply voltage VDD1 to the first level shift circuit 51 via an input node NA.

The first level shift circuit 51 conducts a level shift process on the input digital signals DA and XDA of low amplitude (VSS to VDD1), thereby generating voltage signals DB, XDB, DC, and XDC having an amplitude near the potential difference between the medium power supply potential VDD2 and the reference power supply potential VSS. The phases of the voltage signals DB and XDB are opposite to each other, and the phases of the voltage signals DC and XDC are also opposite to each other. The first level shift circuit 51 supplies those voltage signals DB, XDB, DC, and XDC to the second level shift circuit 52.

The second level shift circuit 52 conducts a level shift process on the voltage signals DB, XDB, DC, and XDC of medium amplitude (VSS to VDD2), which were supplied from the first level shift circuit 51, thereby generating output voltage signals DE and XDE having an amplitude near the potential difference between the high power supply potential VDD3 and the reference power supply potential VSS, or in other words, high amplitude (VSS to VDD3). The phases of the output voltage signals DE and XDE are opposite to each other.

The levels of the low power supply potential VDD1, medium power supply potential VDD2, high power supply potential VDD3, and reference power supply potential VSS can be represented by the following equation:

$$VSS<VDD1<VDD2<VDD3.$$

In FIG. 1, the voltage polarity of each of the low power supply potential VDD1, medium power supply potential VDD2, and high power supply potential VDD3 with respect to the reference power supply potential VSS is positive.

As shown in FIG. 1, the first level shift circuit 51 includes N-channel MOS (metal-oxide-semiconductor) transistors 11 and 12 of the first conductivity type, for example, P-channel MOS transistors 21 and 22 of the second conductivity type, for example, and resistance elements 31 and 32.

The respective source terminals of the transistors 11 and 12 are connected to a first power supply terminal TM1 that receives the reference power supply potential VSS. The drain terminal of the transistor 11 is connected to a first node N1, and the gate terminal receives the input digital signal DA. The drain terminal of the transistor 12 is connected to a second node N2, and the gate terminal receives the input digital signal XDA.

The respective source terminals of the transistors 21 and 22 are connected to a second power supply terminal TM2 that receives the medium power supply potential VDD2. The drain terminal of the transistor 21 is connected to a third node N3, and the gate terminal is connected to the node N2.

The drain terminal of the transistor 22 is connected to a fourth node N4, and the gate terminal is connected to the node N1.

The resistance element 31 is configured such that the potential difference between the first node N1 and the third node N3 is equal to or greater than a prescribed first voltage value when the current flows, and that the potential difference is smaller than the first voltage value when the current is shut off. It is preferable that the first voltage value be a voltage value corresponding to an absolute value of the threshold voltage of the transistor 22. The resistance element 32 is configured such that the potential difference between the second node N2 and the fourth node N4 is equal to or greater than a prescribed second voltage value when the current flows, and that the potential difference is smaller than the second voltage when the current is shut off. It is preferable that the second voltage value be a voltage value corresponding to an absolute value of the threshold voltage of the transistor 21.

With the configuration of FIG. 1, the first level shift circuit 51 generates the voltage signals described below at the nodes N1 to N4, respectively, which were subjected to the level shift to change the amplitude of the input digital signals DA and XDA from an amplitude between the low power supply potential VDD1 and the reference power supply potential VSS to an amplitude between the medium power supply potential VDD2 and the reference power supply potential VSS, and supplies those signals to the second level shift circuit 52. That is, the first level shift circuit 51 supplies, to the second level shift circuit 52, the voltage signal DB generated at the node N2, the voltage signal XDB generated at the node N1, the voltage signal DC generated at the node N4, and the voltage signal XDC generated at the node N3.

On the other hand, the second level shift circuit 52 includes N-channel MOS transistors 13 and 14 of the first conductivity type, for example, and P-channel MOS transistors 23, 24, 33, and 34 of the second conductivity type, for example.

The respective source terminals of the transistors 13 and 14 are connected to the first power supply terminal TM1 that receives the reference power supply potential VSS. The drain terminal of the transistor 13 is connected to an output node NO1, and the gate terminal is connected to the node N1 of the first level shift circuit 51. The drain terminal of the transistor 14 is connected to an output node NO2, and the gate terminal is connected to the node N2 of the first level shift circuit 51.

The respective source terminals of the transistors 23 and 24 are connected to a third power supply terminal TM3 that receives the high power supply potential VDD3. The drain terminal of the transistor 23 is connected to a fifth node N5, and the gate terminal is connected to the output node NO2. The drain terminal of the transistor 24 is connected to a sixth node N6, and the gate terminal is connected to the output node NO1.

The source terminal of the transistor 33 is connected to the node N5, the drain terminal is connected to the output node NO1, and the gate terminal is connected to the node N3 of the first level shift circuit 51.

The source terminal of the transistor 34 is connected to the node N6, the drain terminal is connected to the output node NO2, and the gate terminal is connected to the node N4 of the first level shift circuit 51

With the configuration of FIG. 1, the second level shift circuit 52 generates output voltage signals DE and XDE that vary between the high power supply potential VDD3 and the reference power supply potential VSS based on the voltage signals (DB, XDB, DC, and XDC) that vary between the medium power supply potential VDD2 and the reference power supply potential VSS. The second level shift circuit 52 outputs the output voltage signals DE and XDE via the output node NO1 and output node NO2.

FIG. 1 shows an embodiment in which the voltage polarity of each of the low power supply potential VDD1, medium power supply potential VDD2, and high power supply potential VDD3 with respect to the reference power supply potential VSS is positive, but a case in which the voltage polarity of each of the low power supply potential VDD1, medium power supply potential VDD2, and high power supply potential VDD3 with respect to the reference power supply potential VSS is negative can be implemented with ease. The levels of the respective potentials in such a case can be represented by the following equation:

VSS>VDD1>VDD2>VDD3.

The transistors 11, 12, 13, and 14 of the first conductivity type can be replaced with P-channel MOS transistors, and the transistors 21, 22, 23, 24, 33, and 34 of the second conductivity type can be replaced with N-channel MOS transistors. This applies to respective embodiments below. For ease of explanation, the diagrams and detailed descriptions will be omitted.

Embodiment 1

Figure 2:
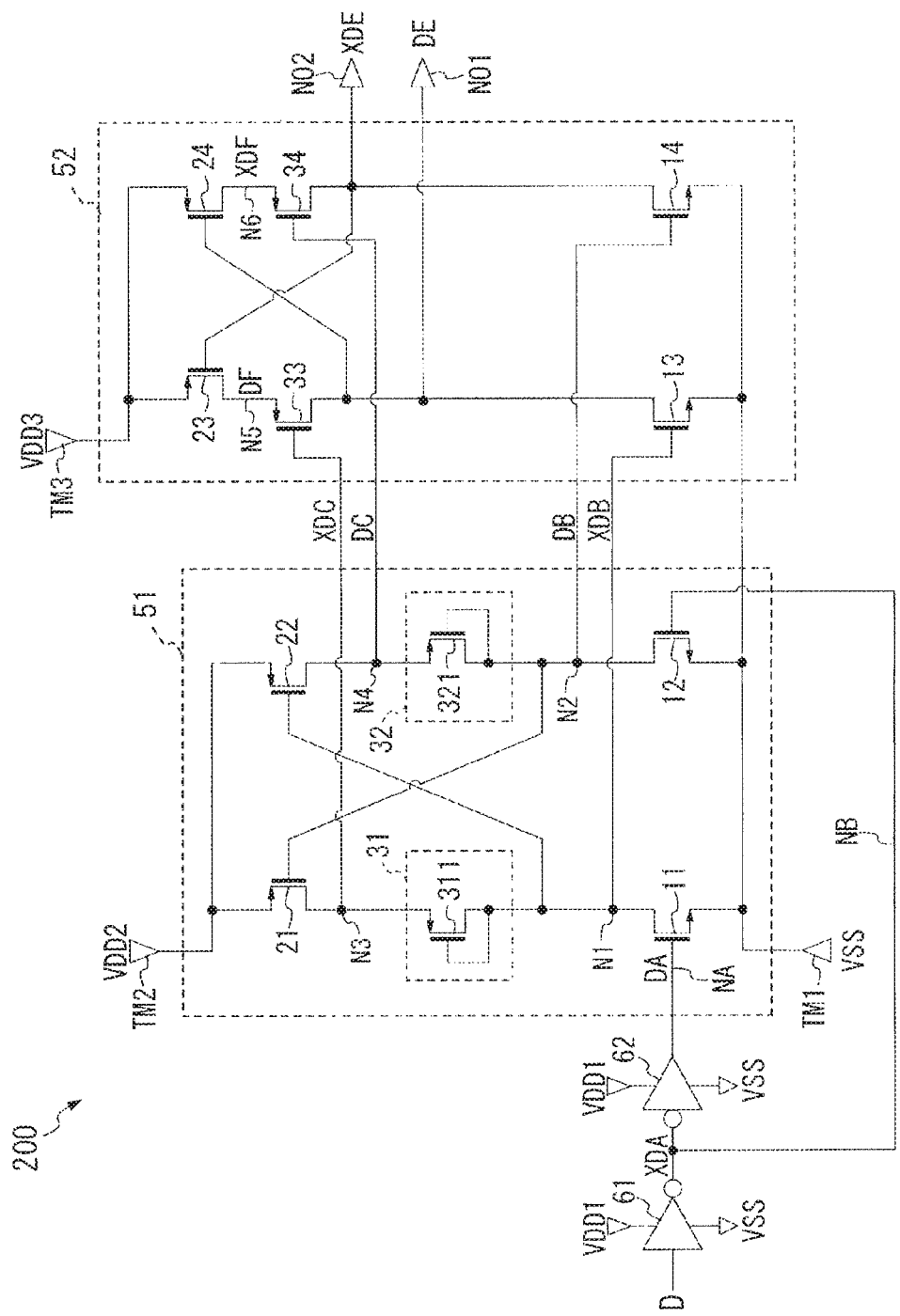
FIG. 2 is a circuit diagram showing the configuration of a level shift circuit 200 of Embodiment 1.

FIG. 2 is a circuit diagram showing the internal configuration of the level shift circuit 200 of Embodiment 1 of the present invention. The level shift circuit 200 of FIG. 2 is the same as that shown in FIG. 1 except that a P-channel MOS transistor 311 that is diode-connected in which the drain and gate terminals are connected to each other is used in place of the resistance element 31 shown in FIG. 1, and a P-channel MOS transistor 321 that is diode-connected in which the drain and gate terminals are connected to each other is used in place of the resistance element 32. The voltage polarity of each of the low power supply potential VDD1, medium power supply potential VDD2, and high power supply potential VDD3 with respect to the reference power supply potential VSS is positive, and the levels of the respective power supply potentials have the same relationship as that of FIG. 1.

In the transistor 311, the gate and drain terminals are connected to the node N1, and the source terminal is connected to the node N3. The transistor 311 is configured such that, when a current flows between the source and drain terminals of the transistor 311, the potential difference between the nodes N1 and N3 is equal to or greater than an absolute value of the threshold voltage of the P-channel transistor 22. The transistor 311 is also configured such that, when a current is shut off, the potential difference between the nodes N1 and N3 is smaller than the absolute value of the threshold voltage of the P-channel transistor 22. This configuration can be made with ease by setting the absolute value of the threshold voltage of the transistor 311 to a smaller value than the threshold voltage of the transistor 22, for example.

In the transistor 321, the gate and drain terminals are connected to the node N2, and the source terminal is connected to the node N4. The transistor 321 is configured such that, when a current flows between the source and drain terminals of the transistor 321, the potential difference between the nodes N2 and N4 is equal to or greater than the absolute value of the threshold voltage of the P-channel transistor 21. The transistor 321 is also configured such that, when a current is shut off, the potential difference between the nodes N2 and N4 is smaller than the absolute value of the threshold voltage of the P-channel transistor 21. This configuration can be made with ease by setting the absolute value of the threshold voltage of the transistor 321 to a smaller value than the threshold voltage of the transistor 21, for example.

Below, the operation of the level shift circuit 200 of FIG. 2 will be explained in detail with reference to FIG. 3.

In the initial state, an input node NA that receives a low-amplitude input digital signal DA is at a low level (VSS), and an input node NB that receives an input digital signal XDA is at a low-amplitude high level (VDD1). In this state, the transistors 11 and 12 of the first level shift circuit 51 are off and on, respectively, and the transistors 21 and 22 are on and off, respectively. The node N2 is at a low level (VSS), and the node N3 is at a medium amplitude high level (VDD2). The node N1 has a voltage Vg that is lower than the medium amplitude high level (VDD2) by an absolute value of the threshold voltage of the transistor 311 due to the presence of the diode-connected transistor 311. The potential difference (VDD2−Vg) between the medium amplitude high level (VDD2) and the voltage Vg of the node N1 is smaller than the absolute value of the threshold voltage of the transistor 22, which turns off the transistor 22. The node N4 has a voltage Vh that is higher than the low level (VSS) by an absolute value of the threshold voltage of the transistor 321 due to the presence of the diode-connected transistor 321.

In the initial state, the transistors 13 and 14 of the second level shift circuit 52 are on and off, respectively, and the transistors 23 and 24 are off and on, respectively. The gate terminal of the transistor 33 receives the voltage of the node N3 (VDD2), which turns on the transistor 33 with the capability corresponding to the potential difference between the high power supply potential VDD3 and the medium power supply potential VDD2. The gate terminal of the transistor 34 receives the voltage Vh of the node N4, which turns on the transistor 34 with the capability corresponding to the potential difference between the high power supply potential VDD3 and the voltage Vh.

In the initial state, the output node NO1 is at a low level (VSS), and the output node NO2 is at the high amplitude high level (VDD3). The node N5 is cramped to a voltage Vj that is higher than the medium power supply potential VDD2 by the absolute value of the threshold voltage of the transistor 33. On the other hand, the node N6 is at the high-amplitude high level (VDD3) that is equal to the output node NO2.

Figure 3:
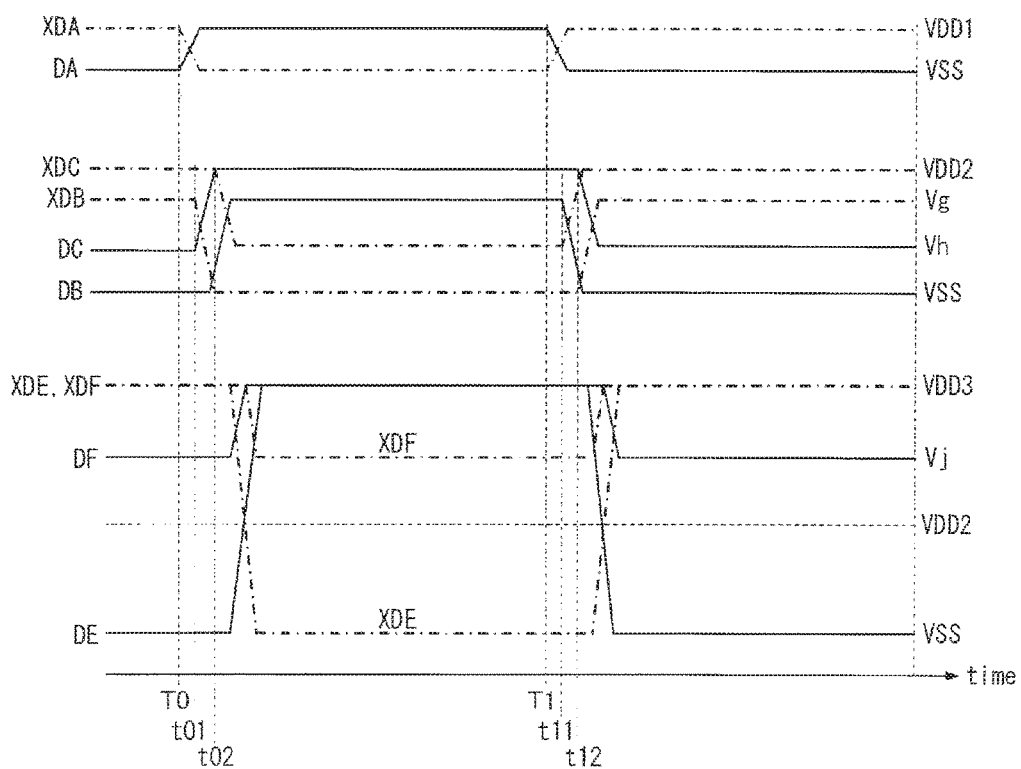
FIG. 3 is a time chart showing the internal operation of the level shift circuit 200 of FIG. 2

FIG. 3 is a time chart showing the internal operation of the level shift circuit 200 in a case in which the level shift circuit 200 is in the initial state described above, and the first level shift of the input digital signals DA and XDA occurs at the time T0, and the next level shift occurs at the time T1.

First, the operation of the first level shift circuit 51 will be explained.

When the low-amplitude digital signals (DA, XDA) change from the initial state, at the time T0, to a high level (VDD1) and low level (VSS), respectively, the transistor 11 is turned on and the transistor 12, which receives the input digital signal XDA, is turned off at the time t01 when the input digital signal DA exceeds the threshold voltage of the transistor 11. When the transistor 11 is turned on, the voltage (XDB) of the node N1 goes down from the voltage Vg to the reference power supply potential VSS, which turns on the transistor 22. When the transistor 22 is turned on, the voltage (DC) of the node N4 is raised from the voltage Vh to the medium power supply potential VDD2. The voltage (DB) of the node N2 immediately after the transistor 12 is turned off is at a low level (VSS), which causes the transistor 21 to be on, but due to the current restricting effect of the diode-connected transistor 311, it is possible to lower the voltage (XDB) of the node N1 to the reference power supply potential VSS even if the discharging capability of the transistor 11 is low.

With the rise of the voltage (DC) of the node N4, the voltage (DB) of the node N2 also goes up from the reference power supply potential VSS to the voltage Vg, which turns off the transistor 21. At this time, the diode-connected transistors 311 and 321 maintain the voltage between the nodes connected to the respective transistors, or in other words, the voltage between the nodes N1 and N3 and the voltage between the nodes N2 and N4 at a level equal to or higher than the threshold value. When a current flows between the drain and source terminals of each of the transistors 311 and 321, the potential difference between the respective nodes increases to a potential difference corresponding to the transistor characteristics.

Due to this effect, even if the transistors 11 and 21 are temporarily turned on at the same time, the through current from the power supply terminal TM2 to TM1 in the first level shift circuit 51 is restricted, and the voltage (VDB) of the node N1 changes quickly. As a result, the period in which the transistors 11 and 21 are turned on at the same time is shortened, and the operation speed of the first level shift circuit 51 increases.

Next, the operation of the second level shift circuit 52 will be explained.

The second level shift circuit 52 receives the voltage signals XDB, DB, XDC, and DC of the respective nodes N1 to N4 from the first level shift circuit 51 to operate. First, by the voltage (XDB) of the node N1 lowering to the reference power supply potential VSS, the transistor 13 is turned off. Next, by an increase of the voltage (DC) of the node N4 to the medium power supply potential VDD2, the gate voltage of the transistor 34 increases, which enhances the current restricting effect of the transistor 34. Next, by an increase of the voltage (DB) of the node N2 to the voltage Vg, the transistor 14 is turned on. Next, by the voltage (XDC) of the node N3 lowering to the voltage Vh, the gate voltage of the transistor 33 lowers, which cancels the current restricting effect of the transistor 33 and improves the current driving capability.

The operation of the second level shift circuit 52 starts at the time t02 when the voltage (DB) of the node N2 exceeds the threshold voltage of the transistor 14 and the transistor 14 is turned on. After the transistor 14 is turned on, the voltage (XDE) of the output node NO2 goes down from the high power supply potential VDD3 to the reference power supply potential VSS, which turns on the transistor 23. Also, the voltage DF of the node N5 is raised from the voltage Vj to the high power supply potential VDD3, and the output node NO1 is raised to the high power supply potential VDD3 via the transistor 33. When the transistor 24 is turned off by the increase of the voltage (DE) of the output node NO1, the voltage XDF of the node N6 lowers to the voltage Vj.

At this time, the transistor 24 is in the on state because the voltage (DE) of the output node NO1 immediately after the transistor 13 is turned off is at a low level (VSS). However, because the current restricting effect of the transistor 34 is mitigated, it is possible to lower the voltage (XDE) of the output node NO2 to the reference power supply potential VSS even when the transistor 14 has a low discharging capability. During this time, the current restricting effect is canceled in the transistor 33, and therefore, the voltage (DE) of the output node NO1 is raised to the high power supply potential VDD3 rapidly.

As described above, the transistors 33 and 34 function as the current restricting element when the voltage of the output node (NO1 or NO2) lowers, and the current restricting effect is canceled when the voltage of the output node increases. Due to this effect, even if the transistors 14 and 24 are temporarily turned on at the same time, the through current from the power supply terminal TM3 to TM1 in the second level shift circuit 52 is restricted, and the voltage (XDE) of the output node NO2 changes quickly. As a result, the period in which the transistors 14 and 24 are turned on at the same time is shortened, and the operation speed of the second level shift circuit 52 improves.

By the transition of the low-amplitude digital signals DA and XDA changing to the high level (VDD1) and the low level (VSS), respectively, at the time T0 shown in FIG. 3, the output voltage signals DE and XDE of the output nodes NO1 and NO2 change to the high level (VDD3) and the low level (VSS), respectively, and enter into a stable state.

In FIG. 3, the operations of the low-amplitude input digital signals DA and XDA changing to the low level (VSS) and the high level (VDD1), respectively, at the time T1 are the same as those of the input digital signals XDA and DA, respectively, at the time T0, and therefore, the descriptions thereof are omitted.

As described above, in the level shift circuit 200 of FIG. 2, the two-phase level shift operation is conducted in which, a digital signal of low amplitude (VSS to VDD1) is first converted to a voltage signal of medium amplitude (VSS to VDD2) by the first level shift circuit 51, and the voltage signal of medium amplitude is converted to a voltage signal of high amplitude (VSS to VDD3) by the second level shift circuit 52 provided after the first level shift circuit 51. By converting low-amplitude digital signals to high-amplitude voltage signals through two phases, a transistor with a low current driving capability can be used for the N-channel MOS transistor, which makes it possible to reduce the amount of the level shift circuit.

Also, the first level shift circuit 51 and the second level shift circuit 52 are equipped with elements that generate the current restricting effects (31, 32, 33, and 34), respectively, and therefore, the through current is suppressed in the respective level shift circuits, and the operation speed can be improved.

Embodiment 2

Figure 4:
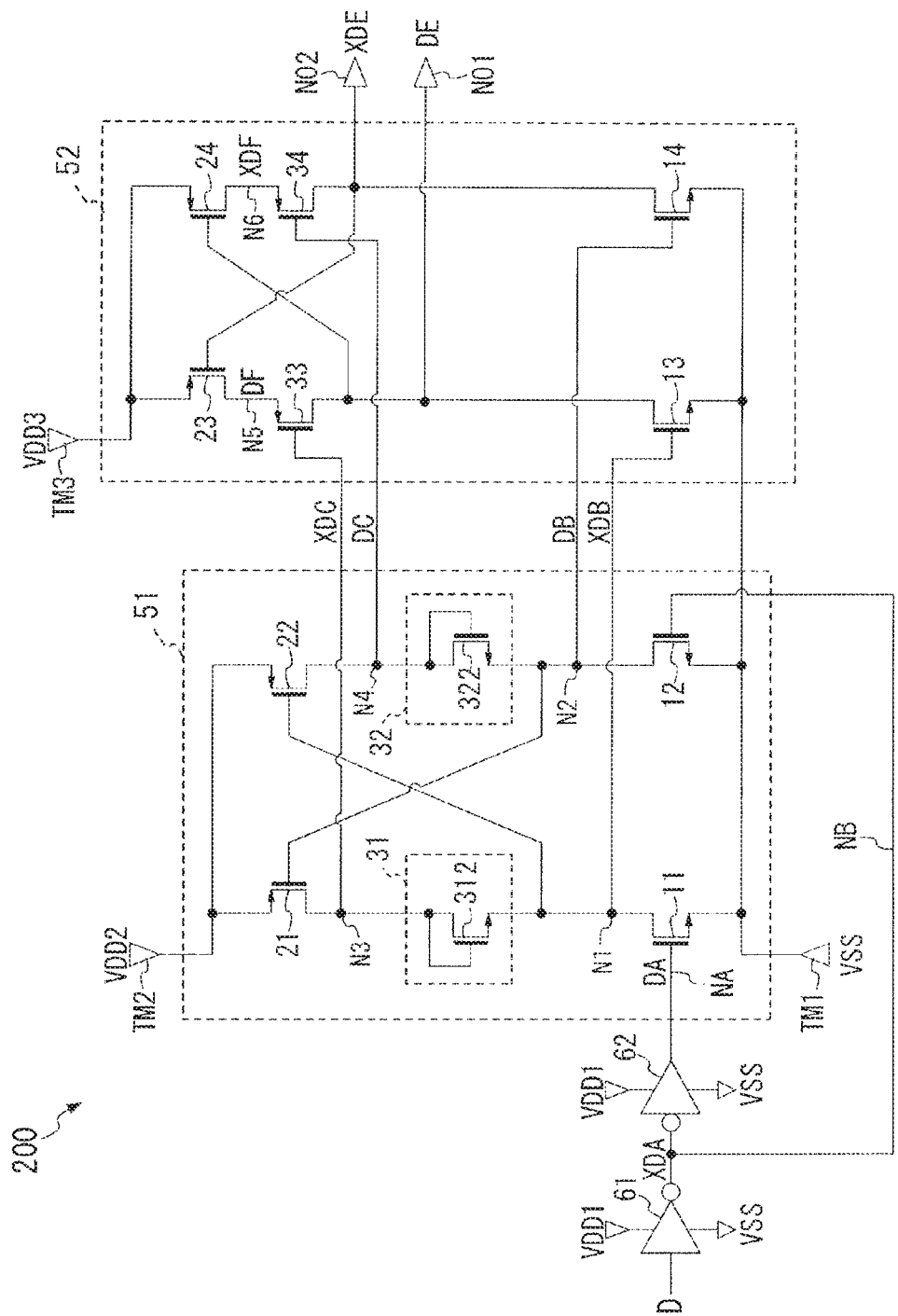
FIG. 4 is a circuit diagram showing the configuration of a level shift circuit 200 of Embodiment 2.

FIG. 4 is a circuit diagram showing the internal configuration of the level shift circuit 200 of Embodiment 2 of the present invention.

In the level shift circuit 200 of FIG. 4, an N-channel MOS transistor 312 is used for the resistance element 31 in place of the P-channel MOS transistor 311, and an N-channel MOS transistor 322 is used for the resistance element 32 in place of the P-channel MOS transistor 321. Other configurations are the same as those of FIG. 2. The relationships of the power supply potentials are the same as those of FIG. 1.

In the transistor 312, the gate and drain terminals are connected to the node N3, and the source terminal is connected to the node N1. In the transistor 322, the gate and drain terminals are connected to the node N4, and the source terminal is connected to the node N2.

The transistor 312 is configured such that the potential difference between the nodes N1 and N3 when the operation current flows is equal to or greater than the absolute value of the threshold voltage of the P-channel transistor 22, and the potential difference between the nodes N1 and N3 when the current is shut off is smaller than the absolute value of the threshold voltage of the P-channel transistor 22. Similarly, the transistor 322 is configured such that the potential difference between the nodes N2 and N4 when the operation current flows is equal to or greater than the absolute value of the threshold voltage of the P-channel transistor 21, and the potential difference between the nodes N2 and N4 when the current is shut off is smaller than the absolute value of the threshold voltage of the P-channel transistor 21.

With this configuration, the level shift circuit of FIG. 4 operates in a manner similar to FIG. 2, and by converting a low-amplitude digital signal to a high-amplitude voltage signal through two phases, a transistor with a low current driving capability can be used for the N-channel MOS transistor, which makes it possible to reduce the amount of the level shift circuit. Also, the first level shift circuit 51 and the second level shift circuit 52 are equipped with elements that generate the current restricting effects (31, 32, 33, and 34), respectively, and therefore, the through current is suppressed in the respective level shift circuits, and the operation speed can be improved.

Embodiment 3

Figure 5:
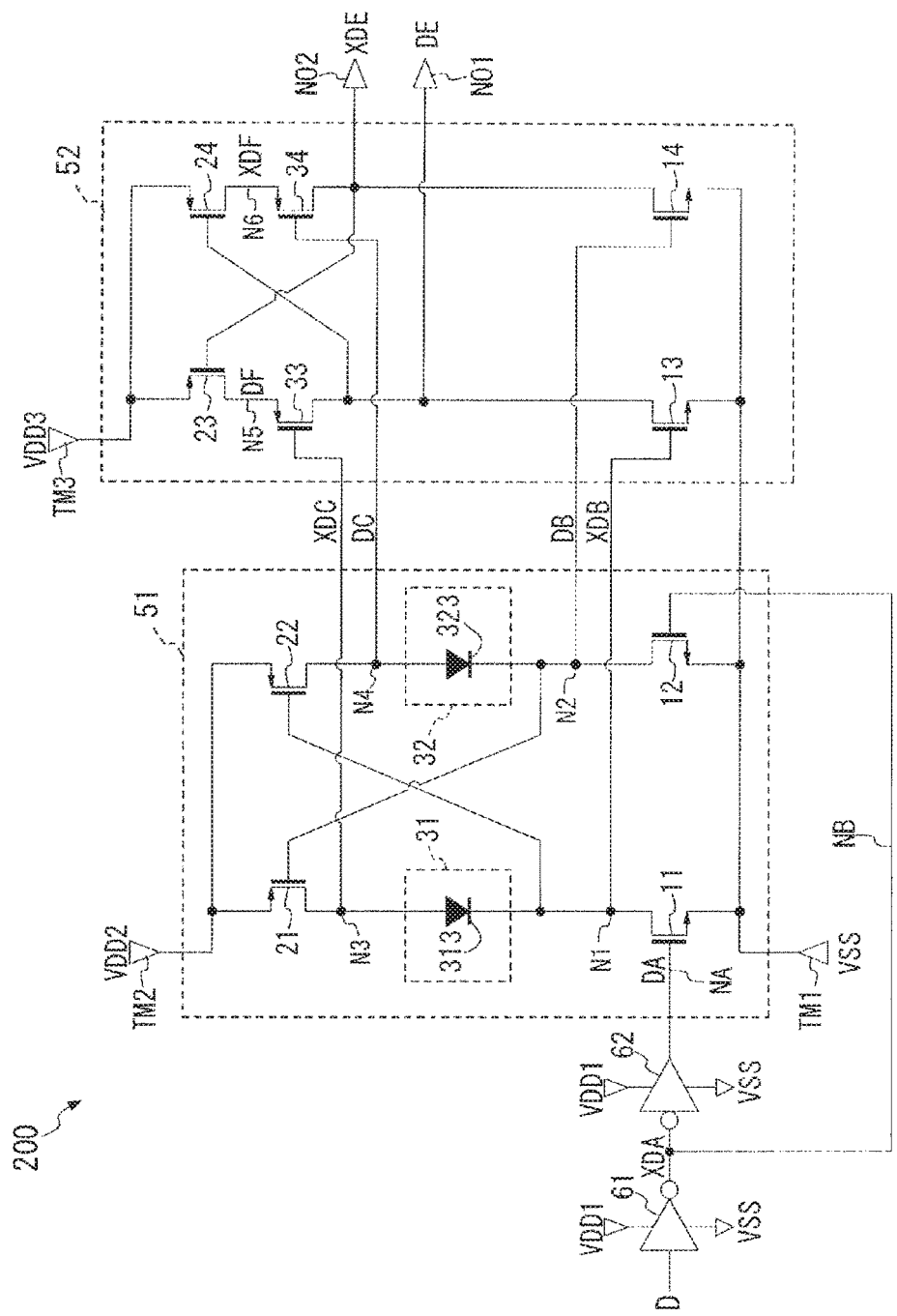
FIG. 5 is a circuit diagram showing the configuration of a level shift circuit 200 of Embodiment 3.

FIG. 5 is a circuit diagram showing the internal configuration of the level shift circuit 200 of Embodiment 3 of the present invention. In the level shift circuit 200 of FIG. 5, a diode 313 is used for the resistance element 31 in place of the MOS transistors (311,312) and a diode 323 is used for the resistance element 32 in place of the transistors (321, 322). Other configurations are the same as those of FIG. 2.

In the diode 313, the anode is connected to the node N3 and the cathode is connected to the node N1. In the diode 323, the anode is connected to the node N4 and the cathode is connected to the node N2.

The diode 313 is configured such that the potential difference between the nodes N1 and N3 when the operation current flows is equal to or greater than the absolute value of the threshold voltage of the P-channel transistor 22, and that the potential difference between the nodes N1 and N3 when the current is shut off is smaller than the absolute value of the threshold voltage of the P-channel transistor 22. Similarly, the diode 323 is configured such that the potential difference between the nodes N2 and N4 when the operation current flows is equal to or greater than the absolute value of the threshold voltage of the P-channel transistor 21, and that the potential difference between the nodes N2 and N4 when the current is shut off is smaller than the absolute value of the threshold voltage of the P-channel transistor 21.

With this configuration, the level shift circuit of FIG. 5 operates in a manner similar to FIG. 2, and by converting a low-amplitude digital signal to a high-amplitude voltage signal through two phases, a transistor with a low current driving capability can be used for the N-channel MOS transistor, which makes it possible to reduce the amount of the level shift circuit. Also, the first level shift circuit 51 and the second level shift circuit 52 are equipped with elements that generate the current restricting effects (31, 32, 33, and 34), respectively, and therefore, the through current is suppressed in the respective level shift circuits, and the operation speed can be improved.

Embodiment 4

Figure 6:
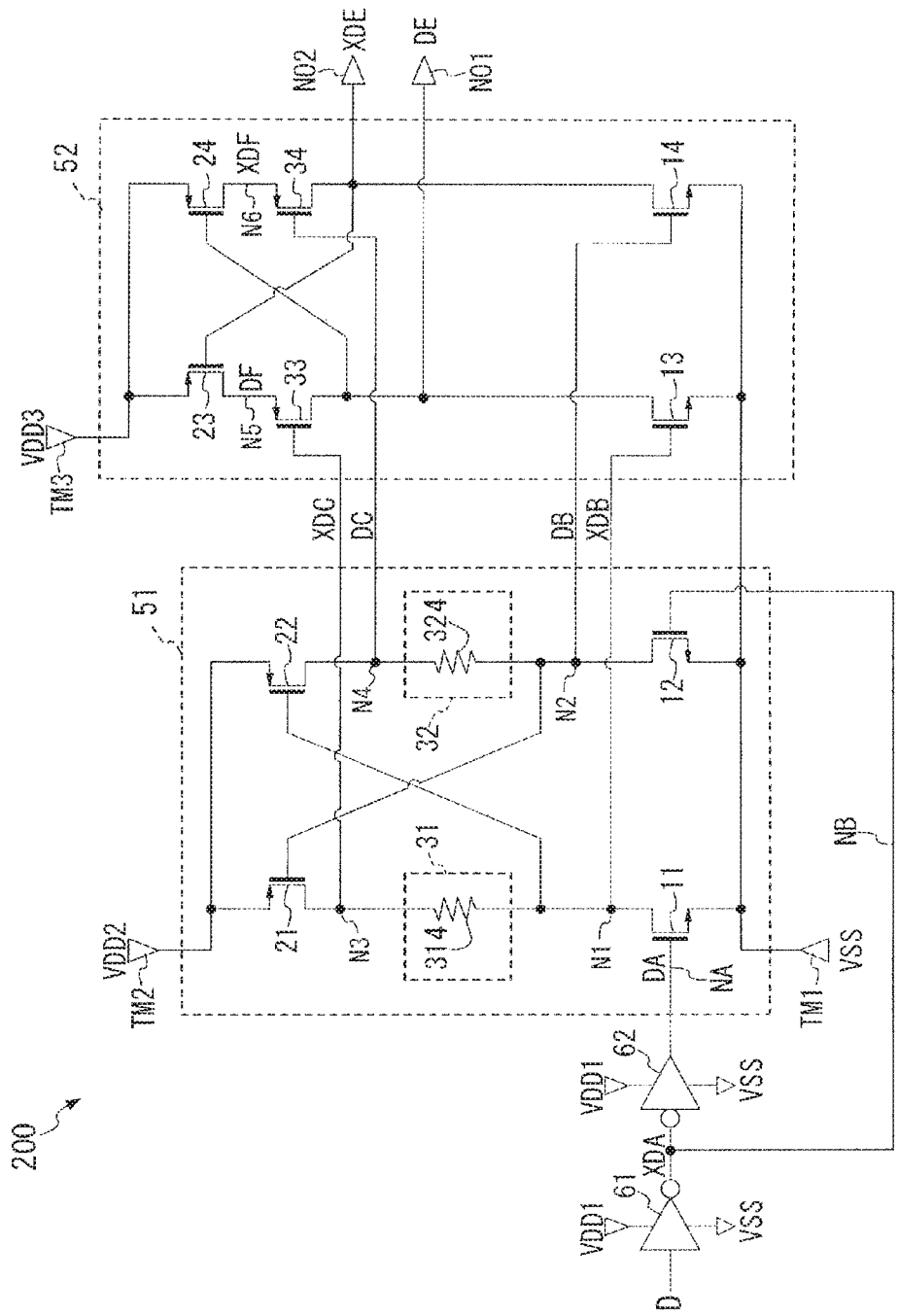
FIG. 6 is a circuit diagram showing the configuration of a level shift circuit 200 of Embodiment 4.

FIG. 6 is a diagram showing the level shift circuit 200 of Embodiment 4 of the present invention. In the level shift circuit 200 of FIG. 6, a resistor 314 is used for the resistance element 31 in place of the transistors (311,312) or diode 313, and a resistor 324 is used for the resistance element 32 in place of the transistors (321, 322) or diode 323. Other configurations are the same as those of FIG. 2.

The resistor 314 is configured such that one end is connected to the node N3 and the other end is connected to the node N1. The resistor 324 is configured such that one end is connected to the node N4 and the other end is connected to the node N2.

The potential difference between the respective nodes connected to the resistors 314 and 324 is determined by the product of resistance value and current of each resistor. Thus, the resistance values of the resistors 314 and 324 are set such that the potential difference between the nodes N1 and N3 and the potential difference between the nodes N2 and N4 when an operation current flows are each equal to or greater than the absolute value of the threshold voltage of the P-channel transistor 22 and the P-channel transistor 21, respectively. When the current is shut off, the potential difference between the respective nodes connected to the resistors 314 and 324 is zero.

Below, the operation of the level shift circuit 200 of FIG. 6 will be explained in detail with reference to FIG. 7.

In the initial state, an input node NA that receives a low-amplitude input digital signal DA is at a low level (VSS), and an input node NB that receives an input digital signal XDA is at a low-amplitude high level (VDD1). In this state, the transistors 11 and 12 of the first level shift circuit 51 are off and on, respectively, and the transistors 21 and 22 are on and off, respectively. The node N2 is at a low level (VSS), and the node N3 is at a medium-amplitude high level (VDD2). The node N1 is at a medium-amplitude high level (VDD2), and the node N4 is at a low level (VSS).

In the initial state, the transistors 13 and 14 of the second level shift circuit 52 are on and off, respectively, and the transistors 23 and 24 are off and on, respectively. The gate terminal of the transistor 33 receives the voltage of the node N3 (VDD2), which turns on the transistor 33 with the capability corresponding to the potential difference between the high power supply potential VDD3 and the medium power supply potential VDD2. The gate terminal of the transistor 34 receives the reference power supply potential VSS of the node N4, which turns on the transistor 34 with the capability corresponding to the potential difference between the high power supply potential VDD3 and the reference power supply potential VSS.

In the initial state, the output node NO1 is at a low level (VSS), and the output node NO2 is at a high-amplitude high level (VDD3). The node N5 is cramped to a voltage Vj that is higher than the medium power supply potential VDD2 by the absolute value of the threshold voltage of the transistor 33. On the other hand, the node N6 is at a high-amplitude high level (VDD3) that is equal to the output node NO2.

FIG. 6 is a time chart showing the internal operation of the level shift circuit 200 in a case where the level shift circuit 200 is in the initial state described above, and the first level shift occurs on the input digital signals DA and XDA at the time T0, and the next level shift occurs at the time T1.

First, the operation of the first level shift circuit 51 will be explained.

When the low-amplitude digital signals (DA, XDA) change from the initial state to a high level (VDD1) and low level (VSS), respectively, at the time T0, the transistor 11 is turned on and the transistor 12, which receives the input digital signal XDA, is turned off at the time t01 when the input digital signal DA exceeds the threshold voltage of the transistor 11. When the transistor 11 is turned on, the voltage (XDB) of the node N1 goes down from the medium power supply potential VDD2 to the reference power supply potential VSS, which turns on the transistor 22. This increases the voltage (DC) of the node N4 from the reference power supply potential VSS to the medium power supply potential VDD2. The voltage (DB) of the node N2 immediately after the transistor 12 is turned off is at a low level (VSS). Thus, while the transistor 21 is in the on state, due to the current restricting effect of the resistor 314, it is possible to lower the voltage (XDB) of the node N1 to the reference power supply potential VSS even if the discharging capability of the transistor 11 is low. With the increase of the voltage (DC) of the node N4, the voltage (DB) of the node N2 also goes up from the reference power supply potential VSS to the medium power supply potential VDD2, which turns off the transistor 21.

When a current flows, the resistors 314 and 324 increase the voltage between the respective nodes connected to those resistors (voltage between the nodes N1 and N3 and voltage between the nodes N2 and N4) to a potential difference determined by the product of the resistance value and current of each resistor. Due to this effect, even if the transistors 11 and 21 are temporarily turned on at the same time, the through current from the power supply terminal TM2 to TM1 in the first level shift circuit 51 is restricted, and the voltage (XDB) of the node N1 changes quickly. As a result, the period in which the transistors 11 and 21 are turned on at the same time is shortened, and the operation speed of the first level shift circuit 51 improves.

Next, the operation of the second level shift circuit 52 will be explained.

The second level shift circuit 52 receives the voltage signals XDB, DB, XDC, and DC of the respective nodes N1 to N4 from the first level shift circuit 51 to operate. First, by the voltage (XDB) of the node N1 lowering to the reference power supply potential VSS, the transistor 13 is turned off. Next, by an increase of the voltage (DC) of the node N4 to the medium power supply potential VDD2, the gate voltage of the transistor 34 increases, which enhances the current restricting effect of the transistor 34 when the current flows. Next, by an increase of the voltage (DB) of the node N2 to the medium power supply potential VDD2, the transistor 14 is turned on. Next, by the voltage (XDC) of the node N3 lowering to the reference power supply potential VSS, the gate voltage of the transistor 33 lowers, which cancels the current restricting effect of the transistor 33 when the current flows and thereby improves the current driving capability.

The operation of the second level shift circuit 52 starts at the time t02 when the voltage (DB) of the node N2 exceeds the threshold voltage of the transistor 14 and the transistor 14 is turned on. After the transistor 14 is turned on, the voltage (XDE) of the output node NO2 goes down from the high power supply potential VDD3 to the reference power supply potential VSS, which turns on the transistor 23. Also, the voltage DF of the node N5 increases from the voltage Vj to the high power supply potential VDD3, and the output node NO1 is raised to the high power supply potential VDD3 via the transistor 33. When the transistor 24 is turned off by the increase of the voltage (DE) of the output node NO1, the voltage XDF of the node N6 lowers to the voltage Vj.

The transistor 24 is in the on state because the voltage (DE) of the output node NO1 immediately after the transistor 13 is turned off is at a low level (VSS). However, because the current restricting effect of the transistor 34 is mitigated, it is possible to lower the voltage (XDE) of the output node NO2 to the reference power supply potential VSS even if the transistor 14 has a low discharging capability. During this time, the current restricting effect is canceled in the transistor 33, and therefore, the voltage (DE) of the output node NO1 rises to the high power supply potential VDD3 rapidly.

As described above, the transistors 33 and 34 function as the current restricting element when the voltage of the output node (NO1 or NO2) lowers, and the current restricting effect is canceled when the voltage of the output node increases. Due to this effect, even if the transistors 14 and 24 are temporarily turned on at the same time, the through current from the power supply terminal TM3 to TM1 in the second level shift circuit 52 is restricted, and the voltage (XDE) of the output node NO2 changes quickly. As a result, the period in which the transistors 14 and 24 are turned on at the same time is shortened, and the operation speed of the second level shift circuit 52 improves.

Figure 7:
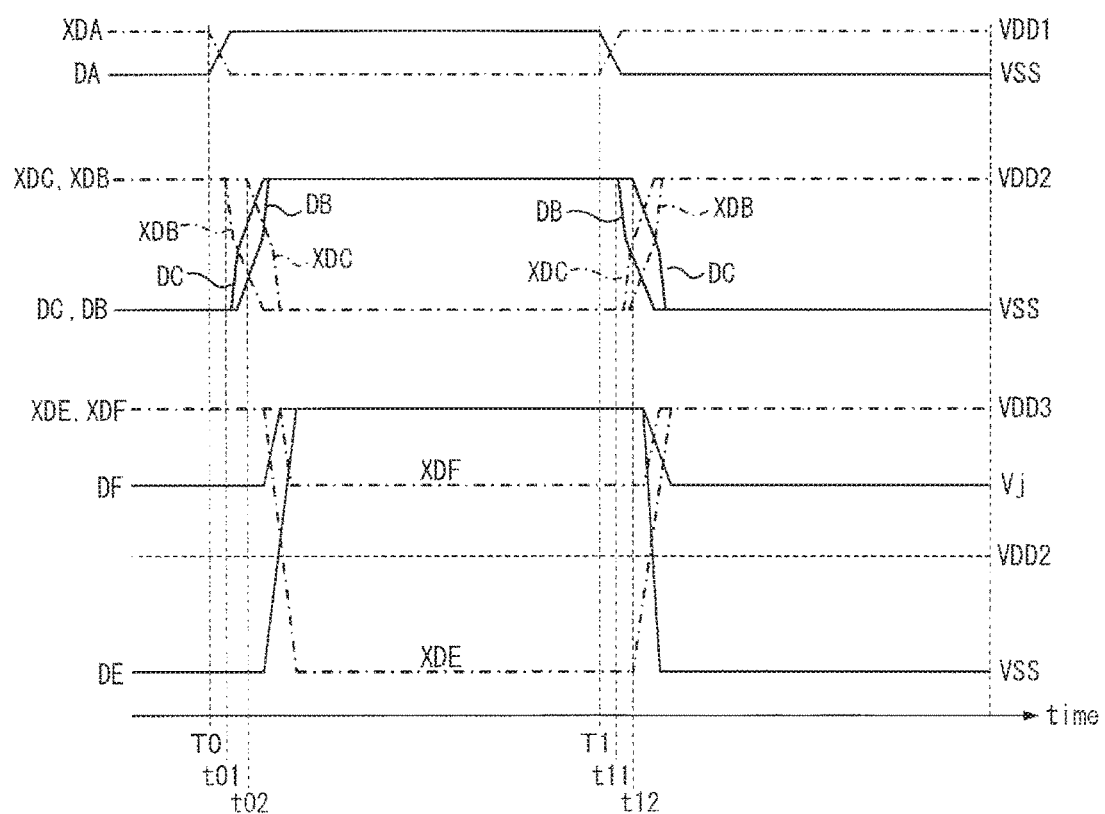
FIG. 7 is a time chart showing the internal operation of the level shift circuit 200 of FIG. 6

By the transition of the low-amplitude digital signals DA and XDA changing to high level (VDD1) and low level (VSS), respectively, at the time T0 shown in FIG. 7, the output voltage signals DE and XDE of the output nodes NO1 and NO2 change to high level (VDD3) and low level (VSS), respectively, and enter into a stable state.

In FIG. 7, the operations of the low-amplitude input digital signals DA and XDA changing to low level (VSS) and high level (VDD1), respectively, at the time T1 are the same as those of the input digital signals XDA and DA, respectively, at the time T0, and therefore, the descriptions thereof are omitted.

As described above, in the level shift circuit 200 of FIG. 6, the two-phase level shift operation is conducted in which, a digital signals of low amplitude (VSS to VDD1) is first converted to a voltage signal of medium amplitude (VSS to VDD2) by the first level shift circuit 51, and the voltage signal of medium amplitude is converted to a voltage signal of high amplitude (VSS to VDD3) by the second level shift circuit 52 provided after the first level shift circuit 51. By converting low-amplitude digital signals to high-amplitude voltage signals through two phases, a transistor with a low current driving capability can be used for the N-channel MOS transistor, which makes it possible to reduce the amount of the level shift circuit.

Also, the first level shift circuit 51 and the second level shift circuit 52 are equipped with elements that generate the current restricting effects (314, 324, 33, and 34), respectively, and therefore, the through current is suppressed in the respective level shift circuits, and the high speed operation is made possible.

In the first and second level shift circuit shown in Embodiments 1 to 4 above, MOS transistors (11 to 14, 21 to 24, 33, 34, 311, 312, 321, and 322) are employed, but bipolar transistors may alternatively be used for those transistors instead of the MOS transistors. That is, any transistor may be used for the respective transistors 11 to 14, 21 to 24, 33, 34, 311, 312, 321, and 322 as long as the transistor has first and second current terminals (drain, source, emitter, collector) and a control terminal (gate, base) for controlling the current that flows between those first and second current terminals.

In other words, a level shift circuit (200) for generating output signals (DE, XDE) by increasing the amplitude of input signals (DA, XDA) needs to include the following first to tenth transistors and the first and second resistance elements.

The first transistor (11) of the first conductivity type has a configuration in which the control terminal receives an input signal (DA), the first current terminal is connected to the first power supply terminal (TM1), and the second current terminal is connected to the first node (N1). The second transistor (12) has a configuration in which the control terminal receives a signal (XDA) having a phase opposite to that of the input signal, the first current terminal is connected to the first power supply terminal, and the second current terminal is connected to the second node (N2). The third transistor (21) has a configuration in which the control terminal is connected to the second node, the first current terminal is connected to the second power supply terminal (TM2), and the second current terminal is connected to the third node (N3). The fourth transistor (22) has a configuration in which the control terminal is connected to the first node, the first current terminal is connected to the second power supply terminal, and the second current terminal is connected to the fourth node (N4). The first resistance element (31) has a configuration in which the potential difference between the first and third nodes when a current flows between the first and third nodes is equal to or greater than the first potential difference, and the potential difference between the first and third nodes when the current is shut off between the first and third nodes is smaller than the first potential difference. The second resistance element (32) has a configuration in which the potential difference between the second and fourth nodes when a current flows between the second and fourth nodes is equal to or greater than the second potential difference, and the potential difference between the second and fourth nodes when the current is shut off between the second and fourth nodes is smaller than the second potential difference.

The fifth transistor (13) has a configuration in which the control terminal is connected to the first node, the first current terminal is connected to the first power supply terminal, and the second current terminal is connected to the first output node (NO1) that outputs an output signal. The sixth transistor (14) has a configuration in which the control terminal is connected to the second node, the first current terminal is connected to the first power supply terminal, and the second current terminal is connected to the second output node (NO2) that outputs a signal having a phase opposite to that of the output signal. The seventh transistor (23) has a configuration in which the control terminal is connected to the second output node, the first current terminal is connected to the third power supply terminal (TM3), and the second current terminal is connected to the fifth node (N5). The eighth transistor (24) has a configuration in which the control terminal is connected to the first output node, the first current terminal is connected to the third power supply terminal (TM3), and the second current terminal is connected to the sixth node (N6). The ninth transistor (33) has a configuration in which the control terminal is connected to the third node, the first current terminal is connected to the fifth node, and the second current terminal is connected to the first output node. The tenth transistor (34) has a configuration in which the control terminal is connected to the fourth node, the first current terminal is connected to the sixth node, and the second current terminal is connected to the second output node.

In the first level shift circuit described in Embodiments 1 to 4 above, the resistance elements (31 or 32) of the same type are respectively disposed on the first current path between the transistor 21 at the higher potential side and the transistor 11 at the lower potential side, and on the second current path between the transistor 22 at the higher potential side and the transistor 12 at the lower potential side. However, resistance elements of different types may be disposed on the first and second current paths, respectively.

That is, one of the resistance elements on the first and second current paths may be any one of the transistor (311 or 312) in which the gate and drain terminals are connected, the diode (313), and the resistor (314), and the other of the resistance elements on the first and second current paths may be any one of the transistor (321 or 322) in which the gate and drain terminals are connected, the diode (323), and the resistor (324).

Embodiment 5

Figure 8:
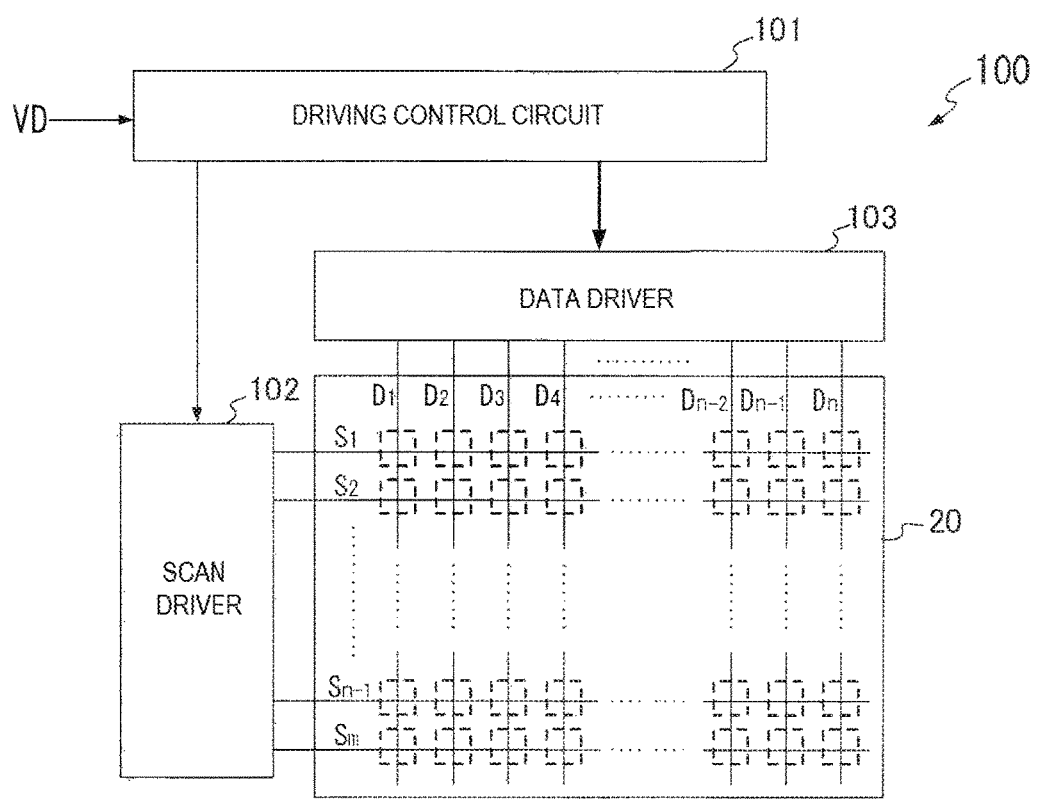
FIG. 8 is a block diagram showing the configuration of a display device 100 equipped with the display driver of the present invention.

FIG. 8 is a block diagram showing the configuration of a display device 100 equipped with a display driver that includes the level shift circuit 200 of the present invention. In FIG. 8, the display device 20 is a liquid crystal panel, organic EL panel, or the like, for example. In the display device 20, m-number (m is a natural number of 2 or greater) of horizontal scan lines $S_1$ to $S_m$ that extend in the horizontal direction of the two-dimensional screen, and n-number (n is a natural number of 2 or greater) of data lines $D_1$ to $D_n$ that extend in the vertical direction of the two-dimensional screen are formed. At each intersection of the horizontal scan lines and data lines, a display cell that functions as a pixel is formed.

A driving control part 101 detects a horizontal synchronization signal from an image signal VD, and supplies the signal to a scan driver 102. The driving control part 101 generates an image data signal PDS and various types of control signals (will be explained later) based on the image signal VD, and supplies those signals to a data driver 103, which is a display driver. The image data signal PDS includes a series of pixel data PD that represents the brightness level of each pixel by the 256 gradation levels of 8-bit, for example.

The scan driver 102 applies horizontal scanning pulse to each of the horizontal scan lines $S_1$ to $S_m$ of the display device 20 in this order so as to synchronize with the horizontal synchronization signal supplied from the driving control part 101.

The data driver 103 is formed of one or a plurality of semiconductor IC (integrated circuit). The data driver 103 reads out the pixel data PD in the image data signal for one horizontal scan line, or in other words, for n-number of pixels. Then, the data driver 103 generates pixel driving voltages $P_1$ to $P_n$ that each have a gradation voltage corresponding to the brightness gradation represented by bit number of each pixel data pieces, and applies those voltages to the data lines $D_1$ to $D_n$ of the display device 20.

Figure 9:
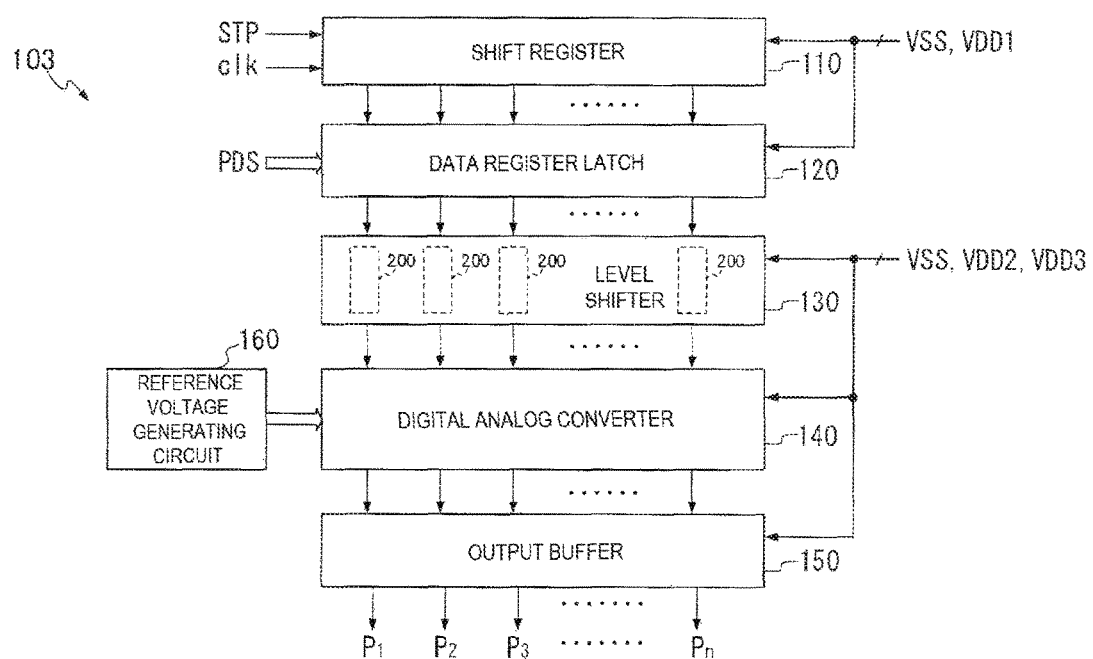
FIG. 9 is a block diagram showing the internal configuration of a data driver 103, which is the display driver of the present invention.

FIG. 9 is a block diagram showing an example of the internal configuration of the data driver 103. As shown in FIG. 9, the data driver 103 includes a shift register 110 as a data acquisition unit, a data register latch 120, a level shifter 130, a digital-analog converter 140, an output buffer part 150, and a reference voltage generating circuit 160.

The shift register 110 generates a plurality of latch timing signals for selecting latches in synchronization with a clock signal clk based on start pulse STP supplied by the driving control part 101, and supplies those signals to the data register latch 120.

The data register latch 120 reads out pixel data PD from the image data signal PDS supplied by the driving control part 101 for the n-number of pixels, based on each latch timing signal supplied by the shift register 110, and supplies n-number of pixel data signals representing the pixel data PD to the level shifter 130.

The level shifter 130 conducts the level shift process to increase the signal level of each bit of the n-number of pixel data signals supplied by the data register latch 120, and supplies n-number of level shift pixel data signals, which were obtained through the level shift process, to the digital-analog converter 140. The reference voltage generating circuit 160 generates a plurality of reference voltages having differing voltage values, and supplies those voltages to the digital-analog converter 140.

The digital-analog converter 140 converts each of the n-number of level shift pixel data signals supplied by the level shifter 130 to one of the plurality of reference voltages, and supplies the obtained n-number of reference voltages to the output buffer part 150.

The output buffer part 150 applies the n-number of reference voltages supplied by the digital-analog converter 140 to the data lines $D_1$ to $D_n$ of the display device 20 as pixel driving voltages $P_1$ to $P_n$.

The shift register 110 and the data register latch 120 receive the reference power supply potential VSS and the low power supply potential VDD1 as power supply voltages. The level shifter 130, the digital-analog converter 140, and the output buffer group 150 receive the reference power supply potential VSS, the medium power supply potential VDD2, and the high power supply potential VDD3 as power supply voltage, respectively.

In the configuration of FIG. 9, the level shifter 130 includes n-number of level shift circuits 200 shown in FIG. 1, 2, 4, 5, or 6, for example, for changing the level of each of the n-number of pixel data signals supplied by the data register latch 120. In the level shift process, each level shift circuit 200 receives a pixel data signal of low amplitude (VSS to VDD1) supplied by the data register latch 120 as an input digital signal D. The level shift circuit 200 then changes the amplitude of the pixel data signal to high amplitude (VSS to VDD3), and supplies the obtained voltage signals (DE, XDE) to the digital-analog converter 140 as a level shift pixel data signal. When the level shift circuit 200 is used for a level shift circuit of a display driver that drives a liquid crystal display panel as described above, the reference power supply potential VSS, the low power supply potential VDD1, the medium power supply potential VDD2, and the high power supply potential VDD3 are as follows, for example:

VSS=ground potential (0V);
VDD1=1.8V;
VDD2=10V; and
VDD3=20V.

In the embodiments above, the inverters 61 and 62 for low-amplitude signals may be built in the data register latch 120. As described above, by employing the level shift circuit 200 of the present invention, the high-speed operation of the display driver of FIG. 9 can be made possible with lower power consumption. Also, because the level shifter 130 requires a smaller area in a semiconductor IC chip, the cost of the display driver can be reduced.

What is claimed is:
1. A level shift circuit configured to generate an output signal having higher amplitude than that of an input signal, comprising:

a first transistor of a first conductivity type, having a control terminal for receiving the input signal, a first current terminal for receiving a first power supply, and a second current terminal;

a second transistor of the first conductivity type, having a control terminal for receiving a signal having a phase opposite to that of the input signal, a first current terminal for receiving the first power supply, and a second current terminal;

a third transistor of a second conductivity type, having a control terminal connected to the second current terminal of the second transistor, a first current terminal for receiving a second power supply, and a second current terminal;

a fourth transistor of the second conductivity type, having a control terminal connected to the second current terminal of the first transistor, a first current terminal for receiving the second power supply, and a second current terminal;

a first resistance element connected between the second current terminal of the first transistor and the second current terminal of the third transistor, a potential difference between two ends of the first resistance element being respectively smaller than, or no smaller than, a predetermined first potential difference when the first resistance element does not have, or has, current between the first and third transistors flowing therethrough;

a second resistance element connected between the second current terminal of the second transistor and the second current terminal of the fourth transistor, a potential difference between two ends of the second resistance element being respectively smaller than, or no smaller than, a predetermined second potential difference when the second resistance element does not have, or has, current between the second and fourth transistors flowing therethrough;

a fifth transistor of the first conductivity type, having a control terminal connected to the second current terminal of the first transistor, a first current terminal for receiving the first power supply, and a second current terminal;

a sixth transistor of the first conductivity type, having a control terminal connected to the second current terminal of the second transistor, a first current terminal for receiving the first power supply terminal, and a second current terminal;

a seventh transistor of the second conductivity type, having a control terminal connected to the second current terminal of the sixth transistor, a first current terminal for receiving a third power supply, and a second current terminal;

an eighth transistor of the second conductivity type, having a control terminal connected to the second current terminal of the fifth transistor, a first current terminal for receiving the third power supply, and a second current terminal;

a ninth transistor of the second conductivity type, having a control terminal connected to the second current terminal of the third transistor, a first current terminal connected to the second current terminal of the seventh transistor, and a second current terminal connected to the second current terminal of the fifth transistor;

a tenth transistor of the second conductivity type, having a control terminal connected to the second current terminal of the fourth transistor, a first current terminal connected to the second current terminal of the eighth transistor, and a second current terminal connected to the second current terminal of the sixth transistor;

a first output node connected to the second current terminal of the fifth transistor and the second current terminal of the ninth transistor, for outputting the output signal; and a second output node connected to the second current terminal of the sixth transistor and the second current terminal of the tenth transistor, for outputting a signal having a phase opposite to that of the output signal.

2. The level shift circuit of claim 1, wherein the input signal has a signal level that is between a reference potential and a first potential that differs from the reference potential;

the first power supply is of the reference potential;

the second power supply is of a second potential, which has a same voltage polarity as that of the first potential, a difference between the second potential and the reference potential being greater than a difference between the first potential and the reference potential, and the third power supply is of a third potential, which has a same voltage polarity as that of the first potential, a difference between the third potential and the reference potential being greater than the difference between the second potential and the reference potential.

3. The level shift circuit of claim 2, wherein when voltage polarities of the first, second and third potentials are all positive, each of the first, second, fifth and six transistors is an N-channel type transistor, and each of the third, fourth, seventh, eighth, ninth and tenth transistors is a P-channel type transistor.

4. The level shift circuit according to claim 2, wherein, when voltage polarities of the first, second and third potentials are all negative, each of the first, second, fifth and six transistors is a P-channel type transistor, and each of the third, fourth, seventh, eighth, ninth and tenth transistors is an N-channel type transistor.

5. The level shift circuit according to claim 2, wherein at least one of the first and second resistance elements includes a metal-oxide-semiconductor (MOS) transistor having a gate terminal and a drain terminal thereof connected to each other.

6. The level shift circuit according to claim 2, wherein at least one of the first and second resistance elements includes a diode element.

7. The level shift circuit according to claim 2, wherein at least one of the first and second resistance elements includes a resistor.

8. The level shift circuit of claim 1, wherein at least one of the first and second resistance elements includes a metal-oxide-semiconductor (MOS) transistor having a gate terminal and a drain terminal thereof connected to each other.

9. The level shift circuit according to claim 1, wherein at least one of the first and second resistance elements includes a diode element.

10. The level shift circuit according to claim 1, wherein at least one of the first and second resistance elements includes a resistor.

11. A level shift circuit configured to generate an output signal having higher amplitude than that of an input signal, comprising:

a first transistor having a control terminal for receiving the input signal, a first current terminal for receiving a first power supply, and a second current terminal;

a second transistor having a control terminal for receiving a signal having a phase opposite to that of the input signal, a first current terminal for receiving the first power supply, and a second current terminal;

a third transistor having a control terminal connected to the second current terminal of the second transistor, a first current terminal for receiving a second power supply, and a second current terminal;

a fourth transistor having control terminal connected to the second current terminal of the first transistor, a first current terminal for receiving the second power supply, and a second current terminal;

a first resistance element connected between the second current terminal of the first transistor and the second current terminal of the third transistor, a potential difference between two ends of the first resistance element being respectively smaller than, or no smaller than, a predetermined first potential difference when the first resistance element does not have, or has, current between the first and third transistors flowing therethrough;

a second resistance element connected between the second current terminal of the second transistor and the second current terminal of the fourth transistor, a potential difference between two ends of the second resistance element being respectively smaller than, or no smaller than, a predetermined second potential difference when the second resistance element does not have, or has, current between the second and fourth transistors flowing therethrough;

a fifth transistor having a control terminal connected to the second current terminal of the first transistor, a first current terminal for receiving the first power supply, and a second current terminal;

a sixth transistor having a control terminal connected to the second current terminal of the second transistor, a first current terminal for receiving the first power supply, and a second current terminal;

a seventh transistor having a control terminal connected to the second current terminal of the sixth transistor, a first current terminal for receiving a third power supply, and a second current terminal;

an eighth transistor having a control terminal connected to the second current terminal of the fifth transistor, a first current terminal for receiving the third power supply, and a second current terminal;

a ninth transistor having a control terminal connected to the second current terminal of the third transistor, a first current terminal connected to the second current terminal of the seventh transistor, and a second current terminal connected to the second current terminal of the fifth transistor, the output signal being outputted through a connection between the second current terminals of the fifth and ninth transistors; and a tenth transistor having a control terminal connected to the second current terminal of the fourth transistor, a first current terminal connected to the second current terminal of the eighth transistor, and a second current terminal connected to the second current terminal of the sixth transistor, a signal having a phase opposite to that of the output signal being outputted through a connection between the second current terminals of the sixth and tenth transistors.

12. A display driver for driving a display panel, comprising:

a level shift circuit configured to generate a level-shifted pixel data signal by increasing amplitude of a pixel data signal that represents a brightness level of a pixel in an image;

a digital analog converter configured to convert the level-shifted pixel data signal to a voltage value; and an output buffer configured to apply a pixel driving voltage having the voltage value to a data line of the display panel, wherein the level shift circuit comprises:

a first transistor of a first conductivity type, having a control terminal for receiving the pixel data signal, a first current terminal for receiving a first power supply, and a second current terminal;

a second transistor of the first conductivity type, having a control terminal for receives a signal having a phase opposite to that of the pixel data signal, a first current terminal for receiving the first power supply, and a second current terminal;

a third transistor of a second conductivity type, having a control terminal connected to the second current terminal of the second transistor, a first current terminal for receiving a second power supply, and a second current terminal;

a fourth transistor of the second conductivity type, having a control terminal connected to the second current terminal of the first transistor, a first current terminal for receiving the second power supply, and a second current terminal;

a first resistance element connected between the second current terminal of the first transistor and the second current terminal of the third transistor, a potential difference between two ends of the first resistance element being respectively smaller than, or no smaller than, a predetermined first potential difference when the first resistance element does not have, or has, current between the first and third transistors flowing therethrough;

a second resistance element connected between the second current terminal of the second transistor and the second current terminal of the fourth transistor, a potential difference between two ends of the second resistance element being respectively smaller than, or no smaller than, a predetermined second potential difference when the second resistance element does not have, or has, current between the second and fourth transistors flowing therethrough;

a fifth transistor of the first conductivity type, having a control terminal connected to the second current terminal of the first transistor, a first current terminal for receiving the first power supply, and a second current terminal;

a sixth transistor of the first conductivity type, having a control terminal connected to the second current terminal of the second transistor, a first current terminal for receiving the first power supply terminal, and a second current terminal;

a seventh transistor of the second conductivity type, having a control terminal connected to the second current terminal of the sixth transistor, a first current terminal for receiving a third power supply, and a second current terminal;

an eighth transistor of the second conductivity type, having a control terminal connected to the second current terminal of the fifth transistor, a first current terminal for receiving the third power supply, and a second current terminal;
a ninth transistor of the second conductivity type, having a control terminal connected to the second current terminal of the third transistor, a first current terminal connected to the second current terminal of the seventh transistor, and a second current terminal connected to the second current terminal of the fifth transistor;
a tenth transistor of the second conductivity type, having a control terminal connected to the second current terminal of the fourth transistor, a first current terminal connected to the second current terminal of the eighth transistor, and a second current terminal connected to the second current terminal of the sixth transistor;
a first output node connected to the second current terminal of the fifth transistor and the second current terminal of the ninth transistor, for outputting the level-shifted pixel data signal; and
a second output node connected to the second current terminal of the sixth transistor and the second current terminal of the tenth transistor, for outputting a signal having a phase opposite to that of the level-shifted pixel data signal.

* * * * *